United States Patent
Matsuda et al.

[11] Patent Number: 6,155,426
[45] Date of Patent: Dec. 5, 2000

[54] CASSETTE CASE FOR HOLDING SUBSTRATES THEREIN

[75] Inventors: Akehiro Matsuda; Haruhiko Ohno, both of Tokyo, Japan

[73] Assignee: NEC Corporation, Tokyo, Japan

[21] Appl. No.: 08/887,891

[22] Filed: Jul. 3, 1997

[30] Foreign Application Priority Data

Jul. 3, 1996 [JP] Japan ................................. 8-173157

[51] Int. Cl.[7] .............................. A47G 19/08; B65D 85/00
[52] U.S. Cl. ......................... 206/708; 206/707; 211/41.1
[58] Field of Search .................................. 206/707, 708, 206/449, 454; 211/41.1, 41.18

[56] References Cited

U.S. PATENT DOCUMENTS

| | | | |
|---|---|---|---|
| 4,261,465 | 4/1981 | Thomas | 206/708 |
| 4,382,517 | 5/1983 | Welsch | 206/454 |
| 4,478,331 | 10/1984 | Ruin | 206/454 |
| 4,746,015 | 5/1988 | Kaucic | 206/708 |
| 4,763,782 | 8/1988 | Sinchok | 206/708 |
| 4,919,277 | 4/1990 | Jeruzal | 206/454 |

FOREIGN PATENT DOCUMENTS 7-101481   4/1995   Japan .

OTHER PUBLICATIONS

English language translation of Taiwanese Office Action dated Apr. 29, 1998 (original in Japanese).

*Primary Examiner*—Paul T. Sewell
*Assistant Examiner*—J. Mohandesi
*Attorney, Agent, or Firm*—Sughrue, Mion, Zinn, Macpeak & Seas, PLLC

[57] ABSTRACT

There is provided a cassette case for holding a plurality of substrates therein, including a cassette case for holding a plurality of substrates therein, including (a) a three-dimensional, hollow frame, and (b) a pair of substrate support members spaced away from each other and carried at the frame with at least one substrate being supported therebetween in the frame. The substrate support members are fixedly carried at the frame at one of longitudinal ends thereof, and at the other of the longitudinal ends thereof so that so that the members are able to expand or contract in a length-wise direction thereof. The above mentioned cassette case ensures that even if the substrate support members thermally expand when the cassette case is thermally treated, there is nothing which obstructs thermal expansion of the substrate support members. Thus, it is possible to eliminate deformation of the substrate support members caused by obstruction to thermal expansion of the substrate support members. As a result, it is possible to solve the problem in a conventional cassette case that a substrate could not be inserted into or taken out of the substrate support members because of deformation of the substrate support members.

9 Claims, 6 Drawing Sheets

CASSETTE CASE FOR HOLDING SUBSTRATES THEREIN

BACKGROUND OF THE INVENTION

1. Field of the Invention

The invention relates to a cassette case for holding a plurality of substrates therein such as liquid crystal panels.

2. Description of the Related Art

A cassette case can hold a plurality of substrates at a time, and hence has been widely used for carrying a plurality of substrates at a time between fabrication steps, or subjecting a plurality of substrates to thermal treatment at a time. Namely, such a cassette case can provide higher productivity as it can hold the greater number of substrates.

However, there would arise a problem that a cassette case becomes heavier as it holds the greater number of substrates therein. Hence, there have been suggested a variety of cassette cases which could hold a lot of substrates, but could prevent an increase in weight thereof.

Figures 1, 2:
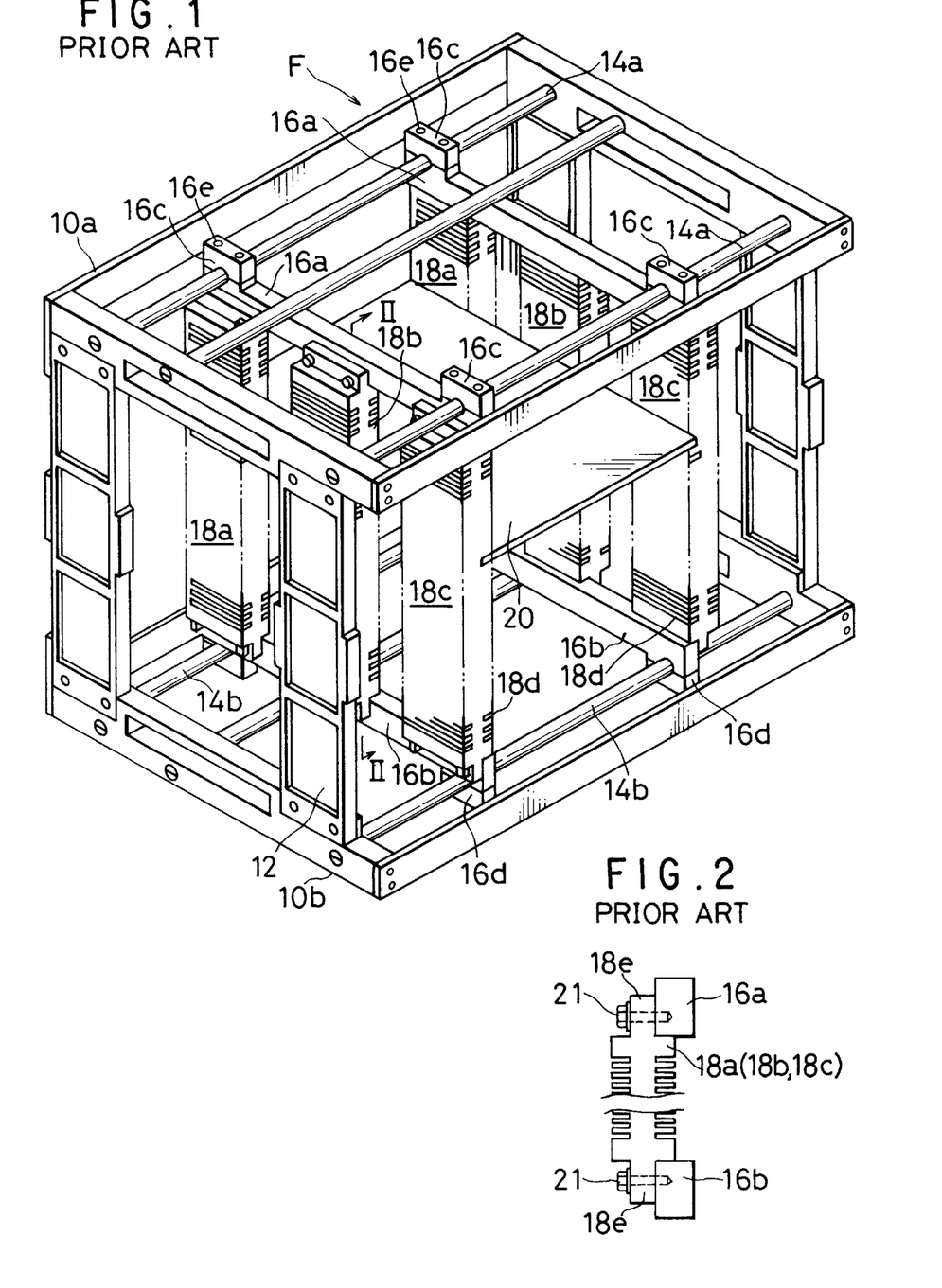
FIG. 1 is a perspective view illustrating a conventional cassette case.
FIG. 2 is a cross-sectional view taken along the line II—II.

One of such cassette cases is illustrated in FIG. 1. The illustrated cassette case includes a frame F comprising a rectangular upper frame portion 10a made of metal such as aluminum, a lower frame portion 10b having the same shape as that of the upper frame portion 10b, and a plurality of pillar members 12 for connecting the upper and lower frame portions 10a and 10b to each other therethrough with the upper and lower frame portions 10a and 10b being spaced away from each other by a height.

A pair of upper slide shafts 14a are carried in parallel between facing sides of the upper frame portions 10a. Similarly, a pair of lower slide shafts 14b are carried between facing sides of the lower frame portions 10b in parallel with each other and also in parallel with the upper slide shafts 14a. The upper slide shafts 14a are spaced away from each other by the same spacing as a spacing between the lower slide shafts 14b.

A pair of bar-shaped upper support members 16a having almost the same length as a spacing between the upper slide shafts 14a are carried just below the upper slide shafts 14a. There are disposed blocks 16c on the upper slide shafts 14a, and the upper support members 16a are fixed to the upper slide shafts 14a by being threaded to the block 16c by means of screws 16e with the upper slide shafts 14a being sandwiched between the blocks 16c and the upper support members 16a. Similarly, a pair of bar-shaped lower support members 16b having almost the same length as a spacing between the lower slide shafts 14b are carried on the lower slide shafts 14b. There are disposed blocks 16d just below the lower slide shafts 14b, and the lower support members 16b are fixed to the lower slide shafts 14b by being threaded to the block 16d by means of screws 16e with the lower slide shafts 14b being sandwiched between the blocks 16d and the lower support members 16b.

There are three substrate support members 18a, 18b, 18c carried in a row between each of the upper and lower support members 16a and 16b. The substrate support members 18a, 18b, 18c carried between one of the upper and lower support members 16a and 16b are disposed in facing relation with the substrate support members 18a, 18b, 18c carried between the other of the upper and lower support members 16a and 16b. The substrate support members 18a, 18b, 18c have the same shape, and are formed at surfaces thereof facing with each other with a plurality of grooves 18d extending horizontally, namely, in a direction perpendicular to a length-wise direction of the substrate support members 18a, 18b, 18c. The grooves 18d are arranged vertically, or in a length-wise direction of the substrate support members 18a, 18b, 18c.

The upper and lower support members 16a and 16b are carried at the upper and lower slide shafts 14a and 14b so that the members 16a and 16b are in advance spaced away from each other by a distance equal to a width of a substrate 20. Thus, a substrate 20 is inserted into the groove 18d formed on surfaces of the substrate support members 18a, 18b, 18c. The cassette case holds the same number of the substrates 20 as the number of the grooves 18d (only one substrate 20 is illustrated in FIG. 1 for simplification of the drawing).

The upper and lower support members 16a and 16b together with the substrate support members 18a, 18b, 18c can be slid along the upper and lower slide shafts 14a and 14b, after the screws 16e fixing the blocks 16c to the upper and lower support members 16a and 16b are released. Hence, when substrates having different width are to be inserted into the grooves 16d, a spacing between the facing substrate support members 18a, 18b, 18c may be varied in accordance with the width of the substrates 20 by sliding the upper and lower support members 16a and 16b together with the substrate support members 18a, 18b, 18c.

The upper and lower frame portions 10a and 10b and the pillar members 12 tend to receive impact and/or oscillation when a cassette case is being transferred, and hence are made of material having great strength such as metal and assembled with screws and nuts. The substrate support members 18a, 18b, 18c are made of resin in order to prevent the substrates 20 made of glass from being abrased, lighten the cassette case, and ensure heat-resistance for the cassette case.

As illustrated in FIG. 2, the substrate support members 18a, 18b, 18c are formed at longitudinal ends thereof or upper and lower ends thereof with tags 18e having a smaller transverse cross-sectional area than that of the substrate support members 18a, 18b, 18c. The substrate support members 18a, 18b, 18c are fixedly connected to the upper and lower support members 16a and 16b by the tags 18e being threaded to the upper and lower support members 16a and 16b by means of screws 21.

When the substrates 20 being held in the cassette case are thermally treated, the frame F as well as the substrates 20 is exposed to high temperature, and thus both of the frame F and the substrates 20 thermally expand. With the pillar members vertically, thermally expanding, the frame F vertically, thermally expands. However, since the pillar members 12 made of metal have a different thermal expansion coefficient from that of the substrate support members 18a, 18b, 18c, the pillar members 12 and the substrate support members 18a, 18b, 18c thermally expand in different degrees. As a result, the substrate support members 18a, 18b, 18c become curved in accordance with a difference in a thermal expansion coefficient between the pillar members 12 and the substrate support members 18a, 18b, 18c.

Hence, the positional relationship between the grooves 18d disposed in facing relation varies accordingly, resulting in that the substrates cannot be inserted into the grooves any more, and that the substrates 20 having been inserted into the grooves 18d cannot be taken out thereof. In particular, when a machine is employed for automatically inserting substrates into grooves and taking substrates out of grooves, the substrates may be abrased or damaged at worst, because such a machine merely inserts substrates into and take substrates out of the grooves without consideration as to whether the substrates can be smoothly inserted into or taken out of the grooves.

The upper and lower frame portions 10a and 10b of the frame F is constructed by connecting metal bars at their edges with each other and fixing them to each other by means of screws. Thus, each time the frame F is subject to thermal treatment, a fastening force of the screws is made to weaken, resulting in that an outer shape of the frame F is deformed, and that it would be difficult for the frame F to keep sufficient rigidity thereof. In addition, there is a limitation with regard to the number of the pillar members 12 ensuring transverse rigidity, from the standpoint of reduction in weight of a cassette case. For those reasons, it is quite difficult for the frame F to have sufficient rigidity. This is accompanied with a problem that when a machine is employed for transferring the cassette case, it would be impossible to precisely position the cassette case.

Figure 3:
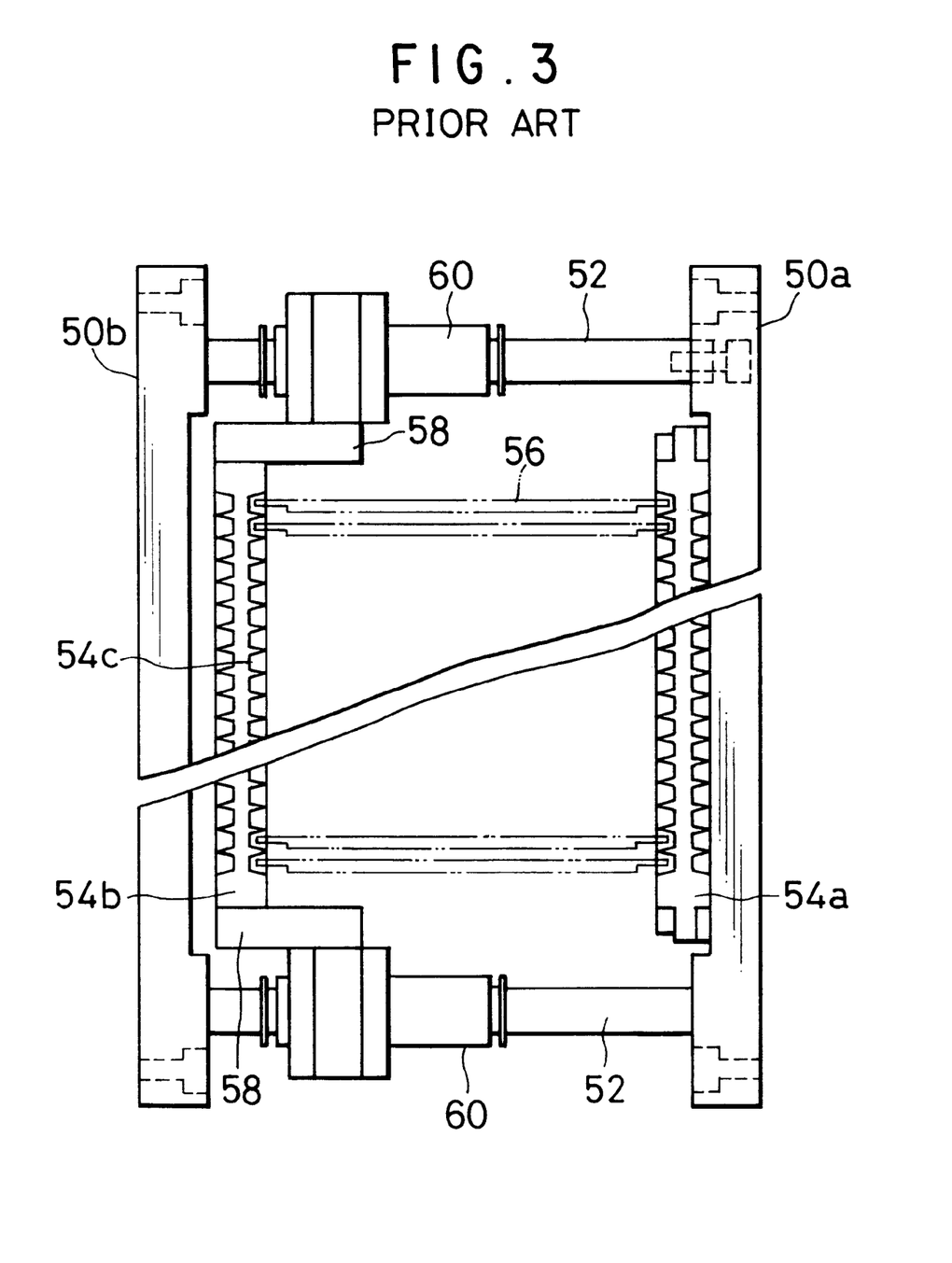
FIG. 3 is a front view illustrating another conventional cassette case.

FIG. 3 illustrates another example of conventional cassette cases for holding a plurality of substrates therein, suggested in Japanese Unexamined Patent Publication No. 7-101481 published on Apr. 18, 1995. The illustrated cassette case includes a pair of outer frames 50a and 50b spaced away from each other. Between the outer frames 50a and 50b are supported a pair of slide shafts 52. A pair of panel holding plates 54a and 54b disposed in facing relating with each other are formed at an outer surface thereof with a plurality of grooves 54c. A plurality of panels 56 are supported between the panel holding plates 54a and 54b by being inserted into the facing grooves 54c. The panel holding plate 54a is fixed to the outer frame 50a, whereas the panel holding plate 54b is fixed to a lock-unlock unit 60 through supports 58. In normal condition, the lock-unlock unit 60 is locked, but if the unit 60 is unlocked, the lock-unlock unit 60 together with the panel holding plate 54b can be slid along the slide shafts 52. Thus, panels having different width can be supported between the panel holding plates 54a and 54b.

The cassette case illustrated in FIG. 3 has the same problems as the above mentioned ones.

SUMMARY OF THE INVENTION

In view of the foregoing problems of the prior cassette cases, it is an object of the present invention to provide a cassette case which does not constitute a hindrance to inserting substrates thereinto or taking substrates out thereof, even if thermally treated.

There is provided a cassette case for holding a plurality of substrates therein, including (a) a three-dimensional, hollow frame, and (b) a pair of members spaced away from each other and carried at the frame with at least one substrate being supported therebetween in the frame. The members are carried at the frame so that at least one of longitudinal ends thereof is able to expand or contract in a length-wise direction thereof.

In the above mentioned cassette case, the substrate support members are carried at the frame so that one of or both of longitudinal ends thereof can expand or contract in a length-wise direction thereof, namely, there exists nothing in extension of the longitudinal ends of the substrate support members. Accordingly, if the cassette case would be subject to thermal treatment to thereby thermally expand, the substrate support members can expand without any obstruction in a length-wise direction thereof. Thus, no deformation would be caused in the cassette case. As a result, even after the cassette case has been thermally treated, it would be possible to insert substrates into or take substrates out of the cassette case.

It is preferable that the members are carried at the frame so that the members are able to expand or contract at one of longitudinal ends thereof in a thickness-wise direction thereof.

When the cassette case is thermally treated, the substrate support members thermally expand not only in a length-wise direction thereof but also in a thickness-wise direction thereof. Thus, it would be possible to prevent the substrate support members from being deformed by supporting the substrate support members to that they may thermally expand in a thickness-wise direction thereof.

There is further provided a cassette case for holding a plurality of substrates therein, including (a) a three-dimensional, hollow frame, and (b) a pair of members spaced away from each other and carried at the frame with at least one substrate being supported therebetween in the frame. The members are fixedly carried at the frame at one of longitudinal ends thereof, and at the other of the longitudinal ends thereof so that so that the members are able to expand or contract in a length-wise direction thereof.

For instance, the substrate support members may be fixed at a lower end thereof to the frame, and supported at an upper end thereof by the frame so that the substrate support members can vertically expand or contract. By supporting the substrate support members in such a way, when the cassette case is thermally treated, the substrate support members thermally, upwardly expand with the lower ends thereof being made not to expand. Since the substrate support members disposed in facing relation thermally expand in the same degree, the positional relation among the grooves disposed in facing relation would be kept unchanged. Thus, a hindrance is not constituted to inserting substrates into or taking substrates out of the grooves.

It is preferable that the substrate support members are carried at the frame so that the members are able to expand or contract at the other of the longitudinal ends thereof in a thickness-wise direction thereof.

There is still further provided a cassette case for holding a plurality of substrates therein, including (a) a three-dimensional, hollow frame, and (b) a pair of members spaced away from each other and carried at the frame with at least one substrate being supported therebetween in the frame. The members are fixedly carried at the frame at a location between longitudinal ends thereof so that the members are able to expand or contract at longitudinal ends thereof in a length-wise direction.

In the above mentioned cassette case, the substrate support members are connected to the frame at a location between the longitudinal ends thereof, and hence the longitudinal ends of the substrate support members are kept free of any obstruction which would interfere with thermal expansion of the substrate support members. Hence, when the cassette case is subject to thermal treatment to thereby thermally expand, the substrate support members can expand in a length-wise direction thereof without being obstructed, resulting in that no deformation would be caused in the substrate support members. Accordingly, even after the cassette case has been thermally treated, it would be possible to insert substrates into or take substrates out of the cassette case.

There is yet further provided a cassette case for holding a plurality of substrates therein, including (a) a rectangular upper frame portion, (b) a lower frame portion having the same shape as that of the upper frame portion, (c) a plurality of pillar members for connecting the upper and lower frame portions to each other therethrough with the upper and lower frame portions being spaced away from each other by a certain distance, (d) a pair of upper slide shafts carried in parallel between facing sides of the upper frame portions, (e) a pair of lower slide shafts carried in parallel between facing sides of the lower frame portions, (f) a pair of upper support members carried at the upper slide shafts, (g) a pair of lower support members carried at the lower slide shafts, (h) a pair of substrate support members each carried between the upper and lower support members, the substrate support members including planes facing with each other which planes are formed with a plurality of grooves into which substrates are inserted to thereby be supported therebetween, the substrate support members being spaced away from each other by a distance by which a substrate is inserted therebetween, (i) fasteners for fixing the substrate support members at one of longitudinal ends thereof to the upper support member, and at the other of longitudinal ends thereof to the lower support member, and (j) first support members formed with a through hole extending in a length-wise direction of the substrate support members, the first support members being fixed to one of the upper and lower support members. The substrate support members are fixedly carried at one of the upper and lower support members at one of longitudinal ends thereof by means of the fasteners, and at the other of the longitudinal ends thereof so that the substrate support members are able to expand or contract in the through hole in a length-wise direction thereof.

For instance, the substrate support members may be fixed at a lower end thereof to the lower support members, and supported at an upper end thereof in the through hole of the first support members so that the substrate support members can vertically expand or contract. By supporting the substrate support members in the above mentioned way, when the cassette case is thermally treated, the substrate support members thermally, upwardly expand with the lower ends thereof being made not to expand. Since the substrate support members disposed in facing relation thermally expand in the same degree, the positional relation among the grooves disposed in facing relation would be kept unchanged. Thus, a hindrance is not constituted to inserting substrates into or taking substrates out of the grooves.

The first support member may have the same thermal expansion coefficient as that of the substrate support members. For instance, the first support member may be made of the same material of which the substrate support members are made.

By designing the first support members to have the same thermal expansion coefficient as that of the substrate support members, the substrate support members thermally expand to the same degree as that of the first support members, when the cassette case is thermally treated. As a result, it is ensured that the positional relation among the grooves disposed in facing relation would be kept unchanged, and hence, a hindrance is not constituted to inserting substrates into or taking substrates out of the grooves.

There is still yet further provided a cassette case for holding a plurality of substrates therein, including (a) a rectangular upper frame portion, (b) a lower frame portion having the same shape as that of the upper frame portion, (c) a plurality of pillar members for connecting the upper and lower frame portions to each other therethrough with the upper and lower frame portions being spaced away from each other by a certain distance, (d) a pair of upper slide shafts carried in parallel between facing sides of the upper frame portions, (e) a pair of lower slide shafts carried in parallel between facing sides of the lower frame portions, (f) a pair of upper support members carried at the upper slide shafts, (g) a pair of lower support members carried at the lower slide shafts, (h) a pair of substrate support members each carried between the upper and lower support members, the substrate support members including planes facing with each other which planes are formed with a plurality of grooves into which substrates are inserted to thereby be supported therebetween, the substrate support members being spaced away from each other by a distance by which a substrate is inserted therebetween, (i) second support members formed with at least one opening extending in a length-wise direction of the substrate support members and having a greater length than that of the substrate support members, the second members being carried by the first and second support members. The substrate support members are carried at the second support members in the opening so that the substrate support members are able to expand or contract in a length-wise direction thereof.

In the cassette case, the substrate support members are carried on the second support member. The second support member is formed with an opening or openings having a length sufficient to cover the entire length of the substrate support members, and the substrate support members are fixed to the second support member so that the substrate support member is all located in the opening. Thus, there is no hindrance to the substrate support members to longitudinally expand or contract, and hence the substrate support members are in a condition to be able to expand and contract. Accordingly, when the cassette is thermally treated, the substrate support members thermally expand both upwardly and downwardly. Hence, when the cassette case is subject to thermal treatment to thereby thermally expand, the substrate support members can expand both upwardly and downwardly in a length-wise direction thereof without being obstructed, resulting in that no deformation would be caused in the substrate support members. As a result, it is ensured that the positional relation among the grooves disposed in facing relation would be kept unchanged, and hence, a hindrance is not constituted to inserting substrates into or taking substrates out of the grooves.

For instance, the substrate support members may be formed between longitudinal ends thereof with a pair of connections extending in a direction perpendicular to a length-wise direction thereof. The substrate support members are carried at the second support member through the connections.

The substrate support members may be carried at the second support member so that the substrate support members are able to expand or contract in a thickness-wise direction thereof.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figures 4, 5:
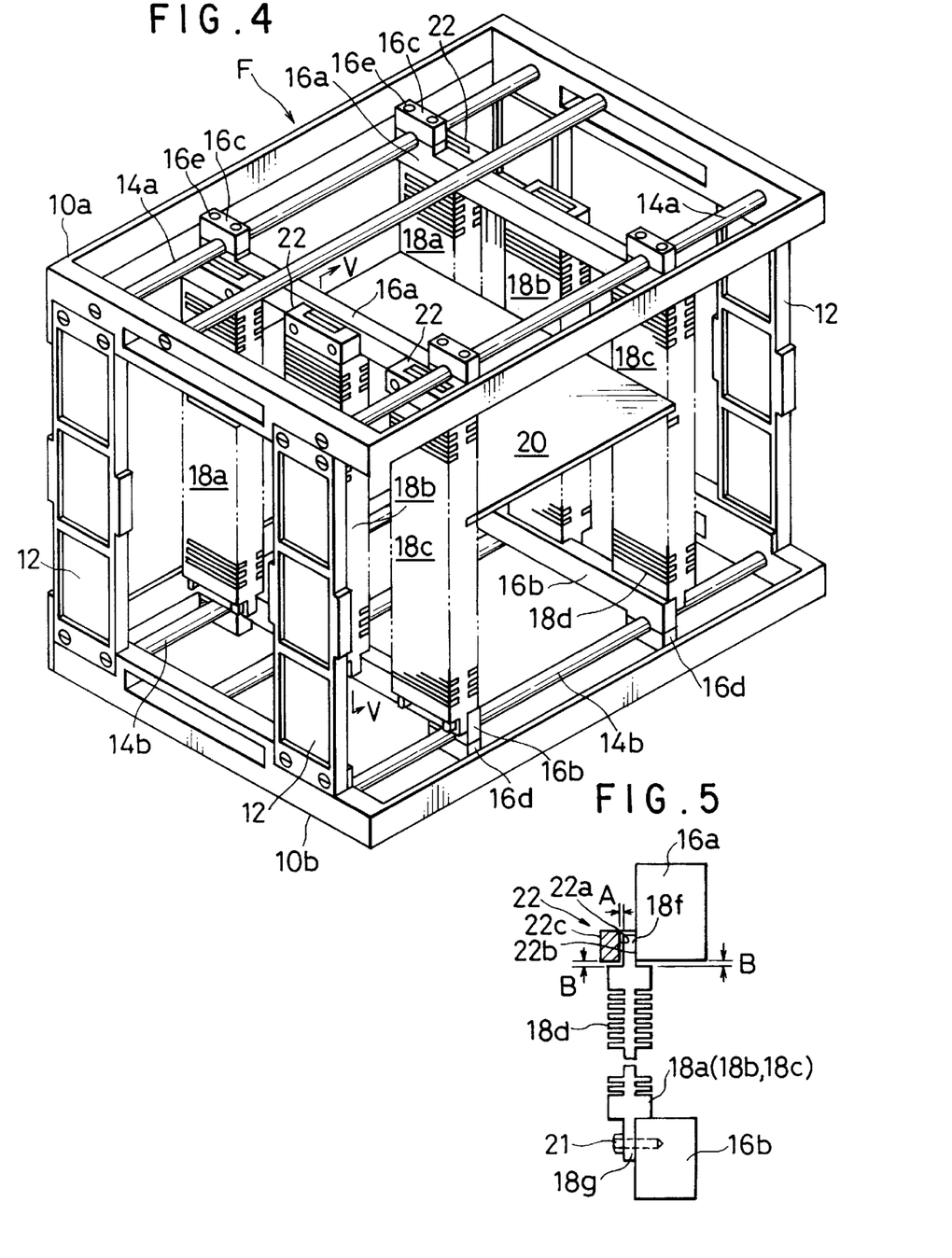
FIG. 4 is a perspective view illustrating a cassette case in accordance with the first embodiment of the present invention.
FIG. 5 is a cross-sectional view taken along the line V—V.

FIG. 4 illustrates a cassette case in accordance with the first embodiment. The illustrated cassette case includes a frame F comprising a rectangular upper frame portion 10a made of aluminum, a lower frame portion 10b having the same shape as that of the upper frame portion 10b and made of aluminum, and four pillar members 12 for connecting the upper and lower frame portions 10a and 10b to each other therethrough with the upper and lower frame portions 10a and 10b being spaced away from each other by a certain distance. The upper and lower frame portions 10a and 10b are welded to each other with electron beams in order to prevent deformation of aluminum frame portions 10a and 10b. The electron beam welding also enhances rigidity of the frame F.

A pair of upper slide shafts 14a are carried in parallel between facing sides of the upper frame portions 10a. Similarly, a pair of lower slide shafts 14b are carried between facing sides of the lower frame portions 10b in parallel with each other and also in parallel with the upper slide shafts 14a. The upper slide shafts 14a are spaced away from each other by the same spacing as a spacing between the lower slide shafts 14b.

A pair of bar-shaped upper support members 16a having almost the same length as a spacing between the upper slide shafts 14a are carried just below the upper slide shafts 14a. There are disposed cube blocks 16c on the upper slide shafts 14a, and the upper support members 16a are fixed to the upper slide shafts 14a by being threaded to the cube blocks 16c by means of screws 16e with the upper slide shafts 14a being sandwiched between the cube blocks 16c and the upper support members 16a. Similarly, a pair of bar-shaped lower support members 16b having almost the same length as a spacing between the lower slide shafts 14b are carried on the lower slide shafts 14b. There are also disposed cube blocks 16d just below the lower slide shafts 14b. The lower support members 16b are fixed to the lower slide shafts 14b by being threaded to the cube blocks 16d by means of screws 16e with the lower slide shafts 14b being sandwiched between the cube blocks 16d and the lower support members 16b.

There are three substrate support members 18a, 18b, 18c carried in a row between each of the upper and lower support members 16a and 16b. The substrate support members 18a, 18b, 18c carried between one of the upper and lower support members 16a and 16b are disposed in facing relation with the substrate support members 18a, 18b, 18c carried between the other of the upper and lower support members 16a and 16b. The substrate support members 18a, 18b, 18c have the same shape, and are formed at facing surfaces thereof with a plurality of grooves 18d extending horizontally, namely, in a direction perpendicular to a length-wise direction of the substrate support members 18a, 18b, 18c. The grooves 18d are arranged vertically, or in a length-wise direction of the substrate support members 18a, 18b, 18c.

The upper and lower support members 16a and 16b are carried at the upper and lower slide shafts 14a and 14b so that the members 16a and 16b are in advance spaced away from each other by a distance equal to a width of a substrate 20. Thus, a substrate 20 is inserted into the groove 18d formed on facing surfaces of the substrate support members 18a, 18b, 18c. The cassette case holds the same number of the substrates 20 as the number of the grooves 18d (only one substrate 20 is illustrated in FIG. 4).

The upper and lower support members 16a and 16b together with the substrate support members 18a, 18b, 18c can be slid along the upper and lower slide shafts 14a and 14b, after the screws 16e fixing the blocks 16c to the upper and lower support members 16a and 16b are released. Hence, when substrates having different width are to be inserted into the grooves 16d, a spacing between the facing substrate support members 18a, 18b, 18c may be varied in accordance with the width of the substrates 20 by sliding the upper and lower support members 16a and 16b together with the substrate support members 18a, 18b, 18c.

As illustrated in FIG. 5 which is a cross-sectional view taken along the line V—V in FIG. 4, the substrate support members 18a, 18b, 18c are formed at upper and lower ends thereof with upper and lower tags 18f and 18g, respectively. The tags 18f and 18g have a smaller transverse cross-sectional area than that of the substrate support members 18a, 18b, 18c. The substrate support members 18a, 18b, 18c are fixedly connected to the lower support members 16b by the lower tags 18g being threaded to the lower support members 16b by means of screws 21.

On the other hand, the substrate support members 18a, 18b, 18c are carried at the upper tags 18f to the upper support members 16a through retainer blocks 22. The retainer blocks 22 are formed with vertically extending, rectangular openings 22a having a width starting from one of sidewalls 22b of the retainer block 22 and terminating at the other sidewall 22c facing the sidewall 22b. Namely, the retainer blocks 22 have almost U-shaped transverse cross-section. The retainer blocks 22 are threaded to the upper support members 16a so that the sidewalls 22c thereof face outwardly and the openings 22a vertically extend.

The upper tags 18f of the substrate support members 18a, 18b, 18c are inserted into the openings 22a of the retainer blocks 22. The openings 22a has a slightly greater width than a width of the upper tag 18f. Hence, since the upper tag 18f is inserted in the opening 22a with a sidewall thereof making contact with a sidewall of the upper support member 16a, there is generated a gap A between the opposite sidewall of the upper tag 18f and an inner sidewall of the opening 22a. In addition, the substrate support members 18a, 18b, 18c are positioned relative to the upper support member 16a so that there is generated a gap B between a proximal end of the upper tag 18f and bottom surfaces of the upper support member 16a and the retainer block 22. The gaps A and B are determined in such a way that the substrate support members 18a, 18b, 18c would not make contact with the retainer block 22 and the upper support member 16a, even if the substrate support members 18a, 18b, 18c thermally expand at a temperature expected to have in thermal treatment.

As mentioned so far, the substrate support members 18a, 18b, 18c are fixed at the lower ends thereof to the lower support member 16b, and carried at the upper ends thereof to the upper support member 16a also that the substrate support members 18a, 18b, 18c can vertically expand and contract. Hence, when the substrate support members 18a, 18b, 18c thermally expand in thermal treatment of the cassette case, the substrate support members 18a, 18b, 18c would thermally expand only upwardly, because the lower ends are made not to expand. Since there is no obstruction for the upper tag 18f to upwardly expand, and since the gap B has a sufficient length which prevents the substrate support members 18a, 18b, 18c from making contact with the upper support member 16a, even if the substrate support members 18a, 18b, 18c thermally expand, the substrate support members 18a, 18b, 18c would thermally expand or contract without any obstruction. Thus, the substrate support members 18a, 18b, 18c disposed in facing relation would thermally expand or contract to the same degree, which ensures that the positional relationship between the grooves 18d formed on the facing surfaces of the substrate support members 18a, 18b, 18c is kept unchanged. In addition, thermal expansion of the substrate support members 18a, 18b, 18c in a thickness-wise direction would be absorbed in the gap A. Accordingly, there would not be constituted a hindrance to inserting the substrates 20 into and taking the substrates 20 out of the grooves 18d.

The inventors had conducted experiments as to how much the substrate support members 18a, 18b, 18c would be deformed in the cassette case in accordance with the above mentioned first embodiment in comparison with the conventional cassette case. The deformation of the substrate support members 18a, 18b, 18c in the conventional cassette case illustrated in FIG. 1 was about 1.5 mm, whereas the deformation of the substrate support members 18a, 18b, 18c in the cassette case in accordance with the first embodiment was less than 0.5 mm.

In the above mentioned embodiment, the substrate support members 18a, 18b, 18c are fixed at the lower tag 18g thereof to the lower support member 16b, and are supported at the upper tag 18f so as to be able to vertically expand and contract. The reverse structure may be taken. That is, the substrate support members 18a, 18b, 18c may be fixed at the upper tag 18f thereof to the upper support member 16a, and are supported at the lower tag 18g so as to be able to vertically expand and contract.

It is preferable that the retainer blocks 22 have the same thermal expansion coefficient as that of the substrate support members 18a, 18b, 18c. This ensures that the gaps A and B formed between the substrate support members 18a, 18b, 18c and the retainer blocks 22 could be kept constant, and thus it is possible to prevent deformation of the substrate support members 18a, 18b, 18c which would be caused by thermal expansion thereof. For instance, the retainer blocks 22 may be made of the same material as that of the substrate support members 18a, 18b, 18c.

Figure 6A:
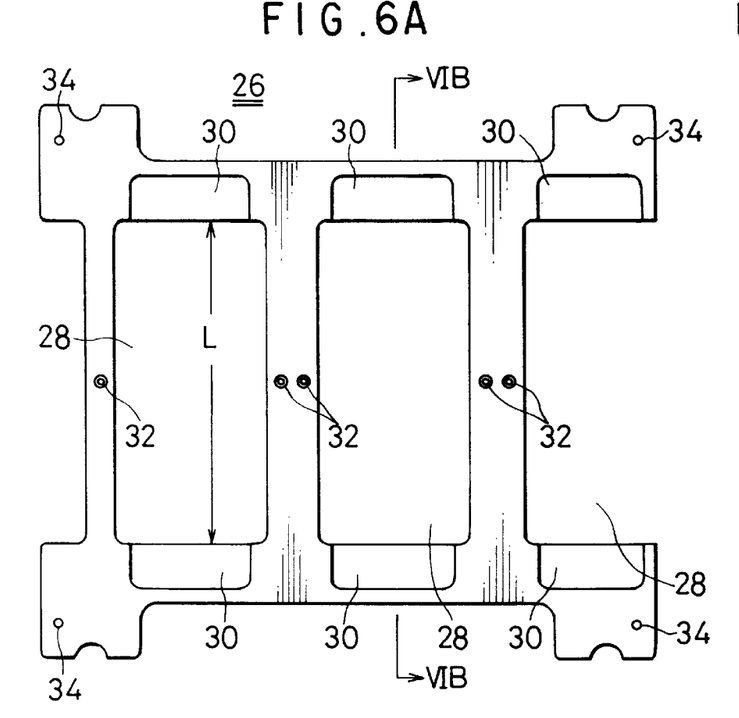
FIG. 6A is a plan view of the second support member used in a cassette case in accordance with the second embodiment of the present invention.
Figure 6B:
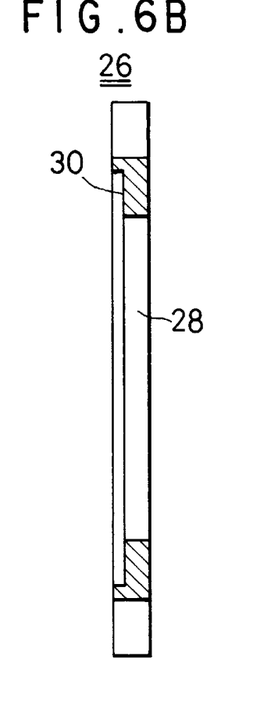
FIG. 6B is a cross-sectional view taken along the line VIB—VIB in FIG. 6A.
Figure 7:
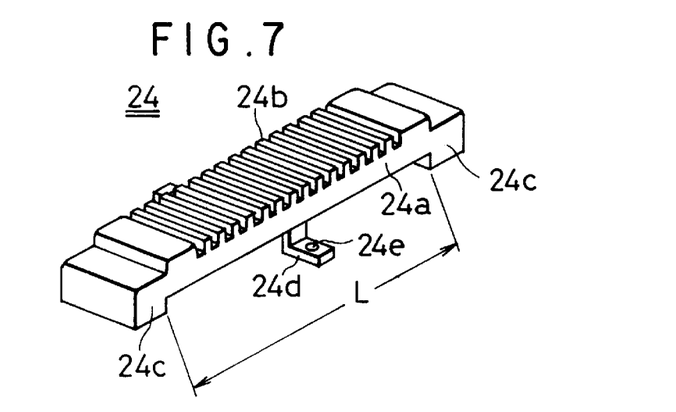
FIG. 7 is a perspective view illustrating a substrate support member.

FIGS. 6A and 6B illustrate a second support member to be used in a cassette case in accordance with the second embodiment, and FIG. 7 illustrates a substrate support member to be used in a cassette case in accordance with the second embodiment. In the second embodiment, the substrate support members 24 are connected to the upper and lower support members 16a and 16b through a support plate 26 as the second support member.

As illustrated in FIG. 7, the substrate support member 24 includes a body 24a having a longitudinal, rectangular cross-section, a plurality of grooves 24b formed on a surface of the body 24a for inserting substrates thereinto, two raised portions 24c formed on an opposite surface of the body 24a at longitudinal ends of the body 24a, and a pair of connections formed at the center between the raised portions 24c and extending in a direction perpendicular to a length-wise direction of the body 24a. The connections 24d have bottom surfaces which are in the same level with bottom surfaces of the raised portions 24c. Each of the connections 24d is formed with a through hole 24e.

As illustrated in FIG. 6A, the support plate 26 as the second support member includes three, almost rectangular openings 28 in a row. Each of the openings 28 has a longitudinal length almost equal to or slightly greater than a length L defined as a length between inner sidewalls of the raised portions 24c. The opening 28 located at the right extends to a right-side edge of the support plate 26. Almost rectangular recessed portions 30 are formed in continuation with upper and lower ends of the openings 28. The recessed portions 30 are complementary in shape with the raised portions 24c, and hence the recessed portions 30 would face the raised portions 24c when the substrate support member 24 is connected onto the support plate 26.

Internally threaded holes 32 are formed at opposite sides of the openings 28 longitudinally at the center of the openings 28. There are formed four through holes 34 in the vicinity of corners of the support plate 26. After the substrate support member 24 has been connected to the support plate 26, the support plate 26 is threaded to the upper and lower support members 16a and 16b through the through holes 34 with screws.

Figure 8A:
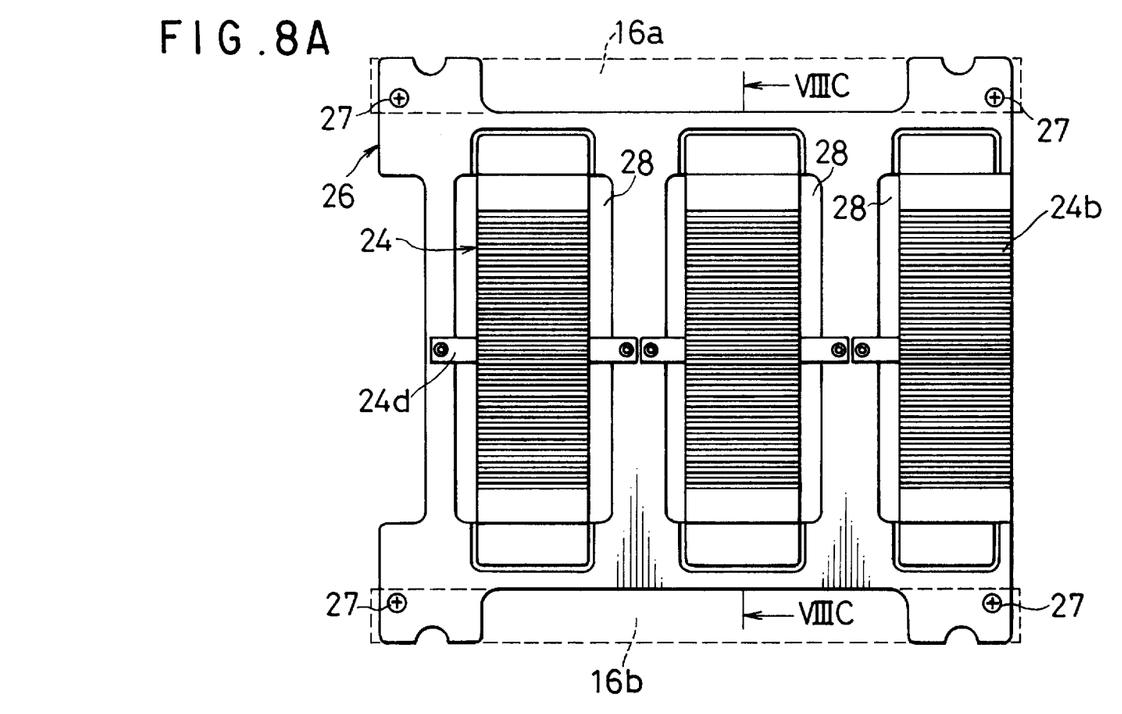
FIG. 8A is a plan view illustrating the second support member to which the substrate support member is fixed.
Figure 8B:
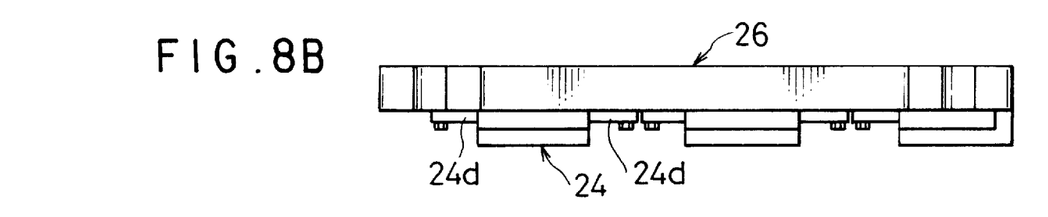
FIG. 8B is a top view of the second support member to which the substrate support member is fixed.
Figure 8C:
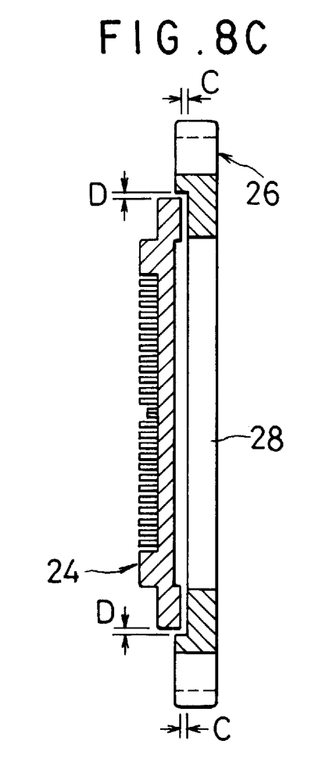
FIG. 8C is a cross-sectional view taken along the line VIIIC—VIIIC in FIG. 8A, illustrating the second support member to which the substrate support member is fixed.

FIGS. 8A to 8C illustrate the support plate 26 illustrated in FIGS. 6A and 6B to which the substrate support member 24 illustrated in FIG. 7 is threaded. As illustrated in FIG. 8A, the through holes 24e formed in the connections 24d of the substrate support member 24 are aligned with the threaded holes 32 of the support plate 26, and then the substrate support member 24 is fixed to the support plate 26 by means of screws 27. When the substrate support member 24 is fixed to the support plate 26 in this way, as illustrated in FIG. 8C, there is formed a gap C between the raised portions 24c of the substrate support member 24 and the recessed portions 30 of the support plate 26, and there is also formed a gap D between upper ends of the substrate support member 24 and upper edges of the recessed portions 30 located upwardly of the recessed portions 30, and also between lower ends of the substrate support member 24 and lower edges of the recessed portions 30 located downwardly of the recessed portions 30. Similarly to the gaps A and B illustrated in FIG. 5, the gaps C and D are determined in such a way that the substrate support member 24 would not make contact with the support plate 26, even if the substrate support member 24 thermally expand in thermal treatment thereof.

As explained above, the substrate support member 24 is connected to the support plate 26 through the connections 24d between the upper and lower ends of the substrate support member 24, and thus the substrate support member 24 is able to thermally expand and contract at upper and lower ends thereof.

Hence, when the substrate support members 24 thermally expand in thermal treatment of the cassette case, the substrate support members 24 would thermally expand longitudinally, or both upwardly and downwardly. Since the gap D has a sufficient length which prevents the substrate support members 24 from making contact with the support plate 26, even if the substrate support members 24 thermally expand, the substrate support members 24 would thermally expand or contract longitudinally without any interference. Thus, the substrate support members 24 disposed in facing relation would thermally expand or contract to the same degree, which ensures that the positional relationship between the grooves 24b formed on the facing surfaces of the substrate support members 24 is kept unchanged. In addition, thermal expansion of the substrate support members 24 in a thickness-wise direction would be absorbed in the gap C. Accordingly, there would not be constituted a hindrance to inserting the substrates 20 into and taking the substrates 20 out of the grooves 24b.

The support plate 26 may be made from one metal plate. Since the support plate 26 has a great modulus of section, the cassette case is ensured to have enhanced transverse rigidity. The inventors had conducted experiments to test rigidity of the cassette case in accordance with the instant embodiment in comparison with the conventional cassette case. In the experiments, certain loads were transversely applied to the cassette case, and deformation of the cassette case was measured. The conventional cassette case illustrated in FIG. 1 deformed by 1.5 mm, whereas the cassette case in accordance with the second embodiment deformed by less than 0.5 mm.

Similarly to the first embodiment, it is preferable for the support plate 26 to have the same thermal expansion coefficient as that of the substrate support member 24. For instance, it is preferable that the support plate 26 and the substrate support member 24 are made of common material.

It is not always necessary for the connections 24c to be formed at the center longitudinally of the substrate support member 24. The connections 24c may be formed at any location between the raised portions 24c, namely in a length L illustrated in FIG. 7.

Figure 9:
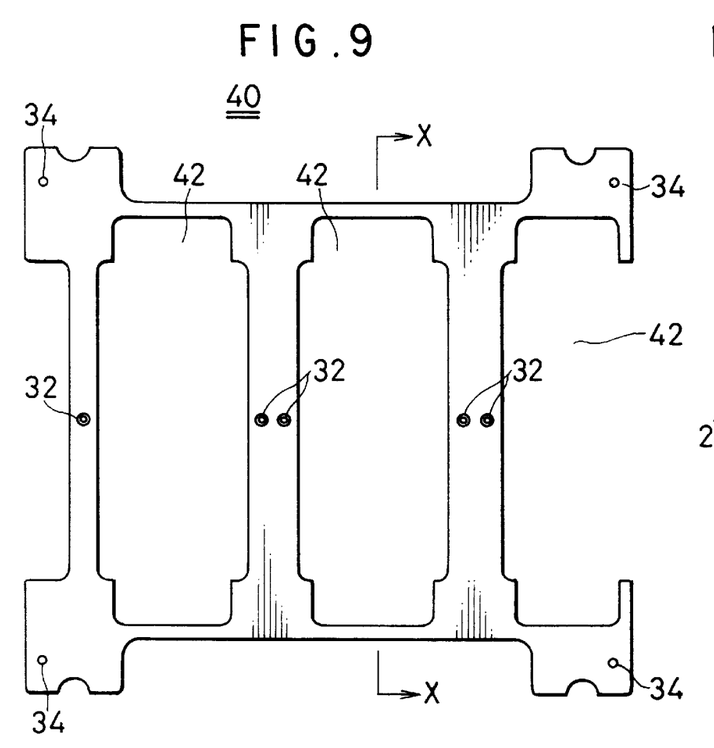
FIG. 9 is a plan view illustrating a variant of the second support member.
Figure 10:
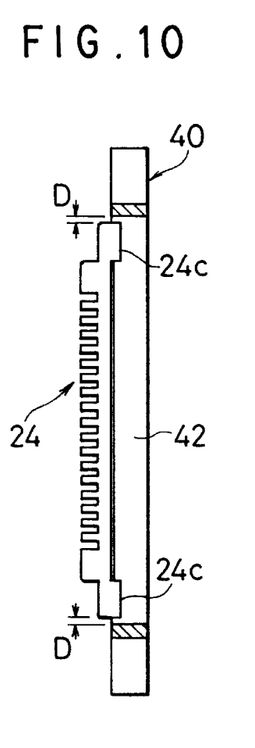
FIG. 10 is a side view illustrating a variant of the second support member to which the substrate support member is fixed.

FIG. 9 illustrates a variant of the support plate 26 illustrated in FIGS. 6A and 6B. A support plate 40 in accordance with the variant is not formed with the recessed portions 30. The recessed portions 30 are all replaced with openings 42. Namely, the support plate 40 has openings 42 which are equivalent in shape to a combination of the opening 28 and the recessed portions 30 located adjacent to the upper and lower edges of the opening 28. Hence, as illustrated in FIG. 10, when the substrate support members 24 are connected to the support plate 40, the substrate support members 24 including the raised portions 24c all lies in the openings 42.

The support plate in accordance with the variant provides the same advantageous effects as those of the support plate 26 illustrated in FIGS. 6A and 6B.

As explained with reference to the preferred embodiments, the substrate support members into which the substrates are inserted are supported so that the substrate support members can thermally, longitudinally expand or contract at one of or both of longitudinal ends thereof. Thus, the cassette case ensures that even if the substrate support members thermally expand when the cassette case is thermally treated, there is nothing which obstructs thermal expansion of the substrate support members, resulting in that it is possible to eliminate deformation of the substrate support members caused by obstruction to thermal expansion of the substrate support members. As a result, it is possible to solve the problem in a conventional cassette case that a substrate could not be inserted into or taken out of the substrate support members because of deformation of the substrate support members.

The addition of the second support plate enhances the rigidity of the cassette case. The second support plate ensures the cassette case to have smaller deformation when it receives an impact, and enhances accuracy at which the cassette case is positioned.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-173157 filed on Jul. 3, 1996 including specification, claims, drawings and summary is incorporated herein by reference in its entirety.

What is claimed is:

1. A cassette case for holding a plurality of substrates therein, comprising:

(a) a three-dimensional, hollow frame; and (b) a pair of members spaced away from each other and carried at said frame with at least one substrate being supported therebetween in said frame, wherein each of said members has at least two longitudinal ends, said members being carried at said frames so that at least one of said longitudinal ends of said members is able to freely expand or contract, without obstruction, in a lengthwise direction.

2. The cassette case as set forth in claim 1, wherein said members are carried at said frame so that said members are able to freely expand or contact, without obstruction, at at least one of said longitudinal ends of said members in a thickness-wise direction.

3. A cassette case for holding a plurality of substrates therein, comprising:

(a) a three-dimensional, hollow frame; and (b) a pair of members spaced away from each other and carried at said frame with at least one substrate being supported therebetween in said frame, wherein each of said members has at least two longitudinal ends, said members being fixedly carried at said frame at one of said longitudinal ends of said members, and at the other of said longitudinal ends of said members so that said members are able to freely expand or contract, without obstruction, in a length-wise direction.

4. The cassette case as set forth in claim 3, wherein said members are carried at said frame so that said members are able to freely expand or contract, without obstruction, at said other of said longitudinal ends of said members in a thickness-wise direction.

5. A cassette case for holding a plurality of substrates therein, comprising:

(a) a three-dimensional, hollow frame; and (b) a pair of members spaced away from each other and carried at said frame with at least one substrate being supported therebetween in said frame, wherein each of said members has at least two longitudinal ends, said members are fixedly carried at said frame at a location between said longitudinal ends of said members so that said members are able to freely expand or contract, without obstruction, at said longitudinal ends of said members in a length-wise direction.

6. The cassette case as set forth in claim 5, wherein said members are carried at said frame so that said members are able to freely expand or contract, without obstruction, at said longitudinal ends of said members in a thickness-wise direction thereof.

7. A cassette case for holding a plurality of substrates therein, comprising:

(a) a rectangular upper frame portion;

(b) a lower frame portion having the same shape as that of said upper frame portion;

(c) a plurality of pillar members for connecting said upper and lower frame portions to each other therethrough with said upper and lower frame portions being spaced away from each other by a certain distance;

(d) a pair of upper slide shafts carried in parallel between facing sides of said upper frame portions;

(e) a pair of lower slide shafts carried in parallel between facing sides of said lower frame portions;

(f) a pair of upper support members carried at said upper slide shafts;

(g) a pair of lower support members carried at said lower slide shafts;

(h) a pair of substrate support members each carried between said upper and lower support members, said substrate support members including planes facing with each other which planes are formed with a plurality of grooves into which substrates are inserted to thereby be supported therebetween, said substrate support members being spaced away from each other by a distance by which a substrate is inserted therebetween;

(i) fasteners for fixing said substrate support members at one of longitudinal ends thereof to said upper support member, and at the other of longitudinal ends thereof to said lower support member; and (j) first support members formed with a through hole extending in a length-wise direction of said substrate support members, said first support members being fixed to one of said upper and lower support members, said substrate support members being fixedly carried at one of said upper and lower support members at one of longitudinal ends thereof by means of said fasteners, and at the other of said longitudinal ends thereof so that said substrate support members are able to expand or contract in said through hole in a length-wise direction thereof.

8. The cassette case as set forth in claim 7, wherein said first support member has the same thermal expansion coefficient as that of said substrate support members.

9. The cassette case as set forth in claim 7, wherein said first support member is made of the same material of which said substrate support members are made.

* * * * *